(12) United States Patent
Wu et al.

(10) Patent No.: US 10,510,763 B2
(45) Date of Patent: *Dec. 17, 2019

(54) EMBEDDED NONVOLATILE MEMORY AND FORMING METHOD THEREOF

(71) Applicant: TAIWAN SEMICONDUCTOR MANUFACTURING CO., LTD., Hsinchu (TW)

(72) Inventors: Chang-Ming Wu, New Taipei (TW); Wei-Cheng Wu, Hsinchu County (TW); Yuan-Tai Tseng, Hsinchu County (TW); Shih-Chang Liu, Kaohsiung (TW); Chia-Shiung Tsai, Hsinchu (TW); Ru-Liang Lee, Hsinchu (TW); Harry Hak-Lay Chuang, Singapore (SG)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 32 days.

This patent is subject to a terminal disclaimer.

(21) Appl. No.: 15/607,337

(22) Filed: May 26, 2017

(65) Prior Publication Data

US 2017/0263616 A1    Sep. 14, 2017

Related U.S. Application Data

(60) Continuation of application No. 14/834,423, filed on Aug. 24, 2015, now Pat. No. 9,673,205, which is a
(Continued)

(51) Int. Cl.
*H01L 27/11521* (2017.01)
*H01L 21/28* (2006.01)
(Continued)

(52) U.S. Cl.
CPC .... *H01L 27/11521* (2013.01); *H01L 21/0217* (2013.01); *H01L 21/02164* (2013.01);
(Continued)

(58) Field of Classification Search
USPC .......................................................... 257/323
See application file for complete search history.

(56) References Cited

U.S. PATENT DOCUMENTS 5,991,204 A    11/1999  Chang
7,005,699 B2 *  2/2006  Chen ............... H01L 27/115
                                                          257/314
(Continued)

FOREIGN PATENT DOCUMENTS

TW    200515543 A    5/2005
TW    200847334 A    12/2008
TW    201409618 A    3/2014

*Primary Examiner* — Chandra Chaudhari
(74) *Attorney, Agent, or Firm* — Maschoff Brennan

(57) ABSTRACT

A nonvolatile memory embedded in an advanced logic circuit and a method forming the same are provided. In the nonvolatile memory, the word lines and erase gates have top surfaces lower than the top surfaces of the control gate. In addition, the word lines and the erase gates are surrounded by dielectric material before a self-aligned silicidation process is performed. Therefore, no metal silicide can be formed on the word lines and the erase gate to produce problems of short circuit and current leakage in a later chemical mechanical polishing process.

20 Claims, 8 Drawing Sheets

Related U.S. Application Data division of application No. 14/229,191, filed on Mar. 28, 2014, now Pat. No. 9,159,842.

(51) Int. Cl.

| | | |
|---|---|---|
| *H01L 21/3213* | (2006.01) | |
| *H01L 21/02* | (2006.01) | |
| *H01L 21/311* | (2006.01) | |
| *H01L 21/3205* | (2006.01) | |
| *H01L 29/423* | (2006.01) | |
| *H01L 29/49* | (2006.01) | |
| *H01L 29/66* | (2006.01) | |
| *H01L 29/788* | (2006.01) | |
| *H01L 21/768* | (2006.01) | |
| *H01L 23/528* | (2006.01) | |
| *H01L 23/532* | (2006.01) | |

(52) U.S. Cl.
CPC .. *H01L 21/02532* (2013.01); *H01L 21/02595* (2013.01); *H01L 21/31111* (2013.01); *H01L 21/32055* (2013.01); *H01L 21/32133* (2013.01); *H01L 21/32137* (2013.01); *H01L 21/768* (2013.01); *H01L 23/528* (2013.01); *H01L 23/5329* (2013.01); *H01L 23/53271* (2013.01); *H01L 29/40114* (2019.08); *H01L 29/4238* (2013.01); *H01L 29/42328* (2013.01); *H01L 29/4916* (2013.01); *H01L 29/6656* (2013.01); *H01L 29/66825* (2013.01); *H01L 29/7883* (2013.01); *H01L 2924/0002* (2013.01)

(56) References Cited

U.S. PATENT DOCUMENTS

| | | | |
|---|---|---|---|
| 8,669,607 B1* | 3/2014 | Tsair | H01L 29/7881 257/316 |
| 2003/0103382 A1 | 6/2003 | Kobayashi | |
| 2012/0201084 A1* | 8/2012 | Lin | H01L 27/15 365/185.26 |
| 2013/0032872 A1 | 2/2013 | Kotov et al. | |
| 2013/0076335 A1* | 3/2013 | Lin | H01L 29/94 257/298 |
| 2013/0242659 A1* | 9/2013 | Yu | H01L 29/788 365/185.14 |
| 2014/0057422 A1* | 2/2014 | Liu | H01L 21/26586 438/510 |

* cited by examiner

US 10,510,763 B2

EMBEDDED NONVOLATILE MEMORY AND FORMING METHOD THEREOF

PRIORITY CLAIM AND CROSS-REFERENCE

The present application is a continuation of U.S. application Ser. No. 14/834,423, filed on Aug. 24, 2015, which is a divisional of U.S. application Ser. No. 14/229,191, filed on Mar. 28, 2014, the disclosure of which are hereby incorporated by reference herein in its entirely.

BACKGROUND

The functionality and performance of an advanced logic circuit for mobile applications can be further enhanced by embedding nonvolatile memory with the advanced logic circuit. However, some problems still need to be solved to integrate a process of a nonvolatile memory with an advanced logic circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1A:
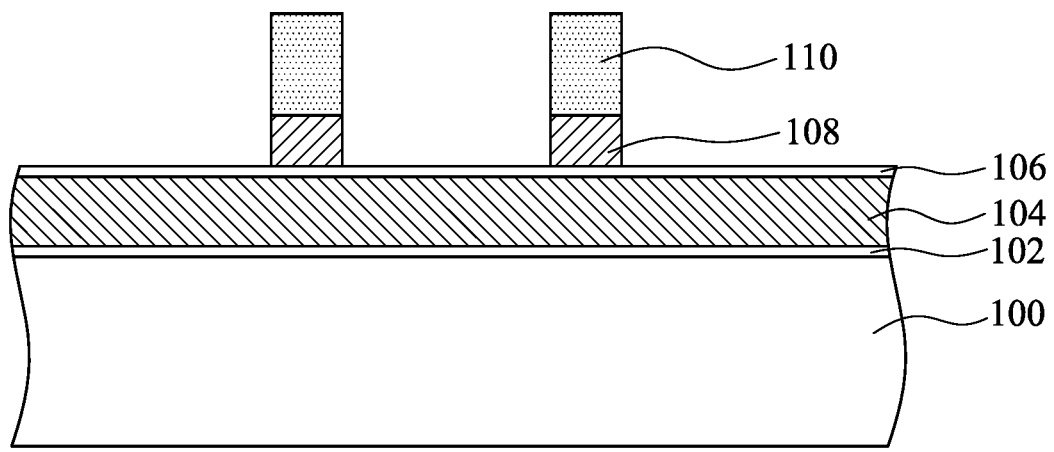
FIGS. 1A-1H are cross-sectional diagrams showing a process of embedded nonvolatile memory according to some embodiments of this disclosure.

The drawings, schematics and diagrams are illustrative and not intended to be limiting, but are examples of embodiments of the disclosure, are simplified for explanatory purposes, and are not drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One problem of integrating nonvolatile memory process with an advanced logic process for mobile applications is caused by forming metal silicide on the top of the word lines and erase gates in the nonvolatile memory area when metal silicide is formed on the source/drain regions of the logic area. After chemical mechanical polishing process, the metal silicide on the top of the word lines will be spread over the entire wafer and problems of short circuit and current leakage are thus produced. Therefore, this disclosure provides a novel process of manufacturing nonvolatile memory that can be integrated with an advanced logic process for mobile applications to solve the problem above. According various embodiments of this disclosure, the nonvolatile memory may be a stacked gate memory.

FIGS. 1A-1H are cross-sectional diagrams showing a process of embedded nonvolatile memory according to some embodiments of this disclosure. In FIGS. 1A-1H, the word lines 122a and the erase gates 122b of the nonvolatile memory formed in FIG. 1E will be etched back in FIG. 1F. Thus, the top surfaces of the word lines 122a and the erase gates 122b is not higher than the top surfaces of the control gates 108 to avoid forming metal silicide on the top surfaces of the word lines 122a and the erase gates 122b.

In FIG. 1A, a tunneling oxide layer 102 and a first polysilicon layer are sequentially formed on a substrate 100, which has isolation structures (not shown in FIG. 1A) formed therein. The first polysilicon layer is then patterned to form plural polysilicon stripes 104 paralleling to the surface of the paper. The isolation structures above may be shallow trench isolations (STIs), for example. The tunneling oxide layer 102 may be formed by a thermal oxidation process. The first polysilicon layer may be formed by chemical vapor deposition and then be patterned by photolithography and followed by dry etching, for example, to form the plural polysilicon stripes 104. The first polysilicon may have a thickness of 150-300 Å, such as 200 Å.

Next, a middle dielectric layer 106, a second polysilicon layer, and a first dielectric layer are sequentially formed above the substrate 100 to cover the plural polysilicon stripes 104 and the tunneling oxide layer 102. The middle dielectric layer 106 may include a bottom silicon oxide layer, a middle silicon nitride layer, and a top silicon oxide layer, for example. The bottom and top silicon oxide layers may be formed by thermal oxidation at a temperature of 800-200° C. followed by annealing at 1000° C., and may have a thickness of 40 Å, for example. The middle silicon nitride layer may be formed by low pressure chemical vapor deposition (LPCVD), and may have a thickness of 80 Å, for example. The second polysilicon layer may be formed by chemical vapor deposition and have a thickness of 300-600 Å, such as 250 Å. The first dielectric layer may be made of silicon nitride deposited by LPCVD and have a thickness of 1000-1500 Å, such as 1300 Å.

Then, the first dielectric layer and the second polysilicon layer are patterned to form mask layers 110 and control gates 108, respectively. The patterning method may be performed by photolithography and followed by dry etching. During the etching of the second polysilicon layer, the mask layers 110 are used as an etching mask.

Figure 1B:
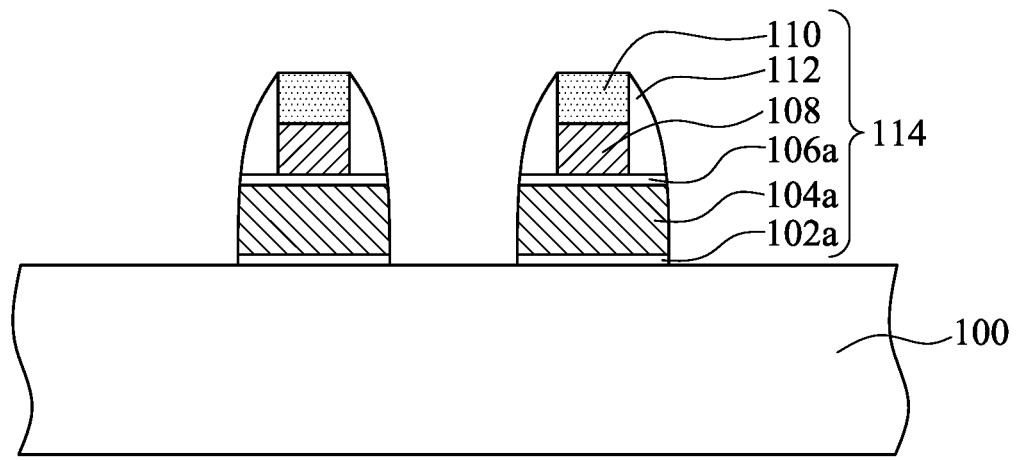

In FIG. 1B, a second dielectric layer is formed above the substrate 100 to conformally cover the mask layers 110, the control gates 108 and the middle dielectric layer 106. Next, the second dielectric layer is anisotropically etched to form first spacers 112 on the sidewalls of the mask layers 110 and the control gates 108. Subsequently, the exposed middle dielectric layer 106, the plural polysilicon stripes 104 and the tunneling oxide layer 102 thereunder are etched to form the middle dielectric layer 106a, the floating gate 104a, and the tunneling oxide layer 102a to form gate stacks 114 on the substrate 100. The second dielectric layer may include a bottom silicon oxide layer, a middle silicon nitride layer, and a top silicon oxide layer.

Figure 1C:
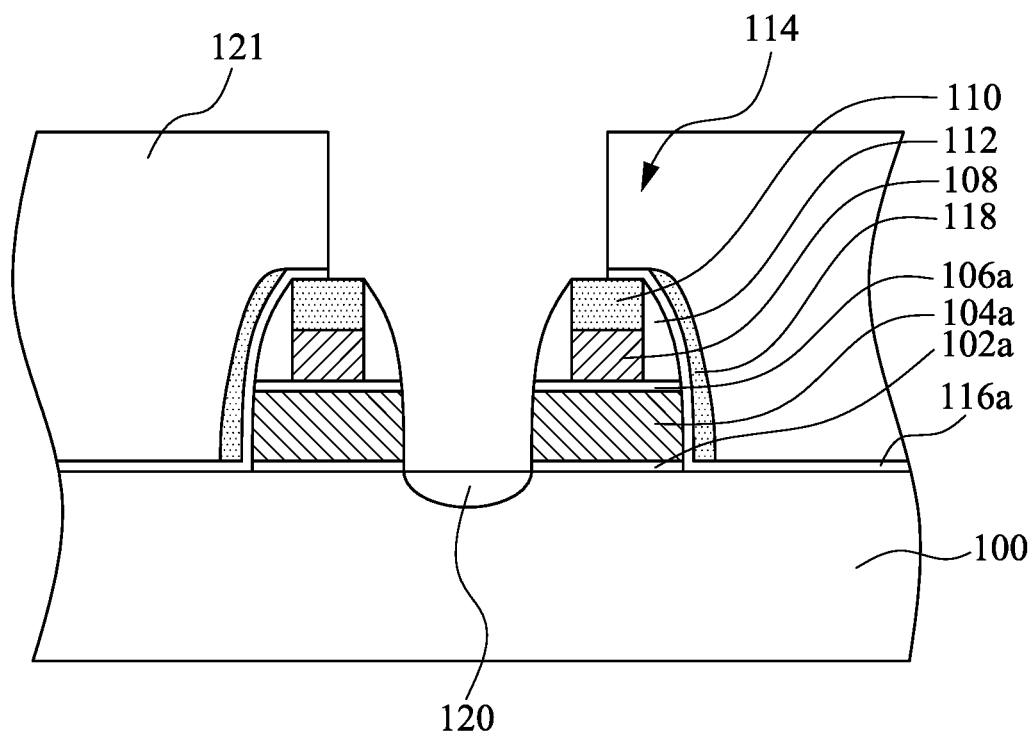

In FIG. 1C, a first buffer layer 116a and a third dielectric layer are sequentially formed above the substrate 100 to conformally cover the exposed surfaces of the gate stacks 114 and the exposed substrate 100. The first buffer layer 116a may be a silicon oxide layer formed by chemical vapor deposition, for example. The third dielectric layer may be a silicon nitride layer formed by LPCVD, for example. The third dielectric layer is then anisotropically etched to form second spacers 118 on sidewalls of the gate stacks 114. The anisotropic etch may be performed by dry etching.

The first buffer layer 116a above is usually used to release the strains caused by lattice mismatch between the third dielectric layer and the exposed silicon layers when the lattice mismatch above is obvious. For example, the exposed silicon layers include floating gates 104a and the substrate 100 in FIG. 1C. However, if the lattice mismatch between the third dielectric layer and the exposed silicon layers is not so obvious to generate obvious strains, the first buffer layer 116a may be omitted.

Next, a patterned photoresist layer 121 is formed by a combination of spin coating, exposing and developing processes to expose the common source area of the substrate 100. Ions are then implanted into the exposed substrate 100 to form the common source 120. Subsequently, the second spacers 118 exposed by the patterned photoresist layer 121 is removed, and the removal method may be performed by dry etching or wet etching, for example. During the removal of the exposed second spacers 118, the first buffer layer 116a may be consumed finally to expose the common source 120.

Figure 1D:
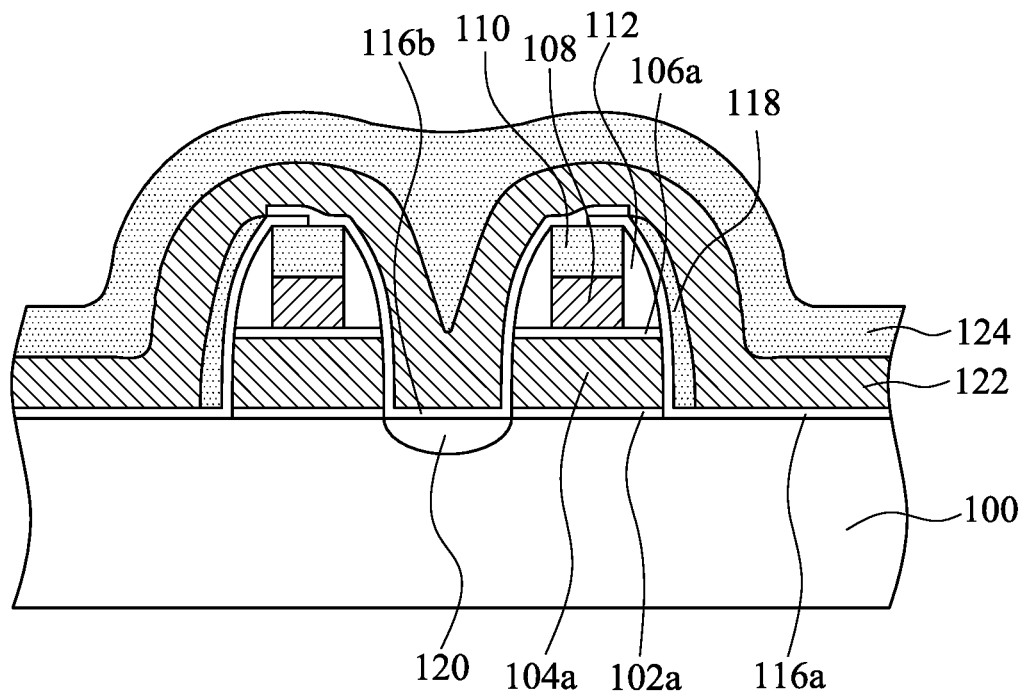

In FIG. 1D, the patterned photoresist layer 121 is removed, and the removal method may be performed by solvent stripping or plasma ashing, for example. Then, a gate oxide layer 116b is formed to cover the exposed substrate 100, i.e. the common source 120. The gate oxide layer 116b may be formed by thermal oxidation.

Next, a third polysilicon layer 122 and a fourth dielectric layer 124 are sequentially formed above the substrate 100. The thickness of the third polysilicon layer 122 is smaller than a total thickness of the tunneling oxide layer 102a, the floating gate 104a, the middle dielectric layer 106a, and the control gates 108, such as in a range from about 400 Å to about 600 Å. The thickness of the fourth dielectric layer 124 is in a range from about 200 Å to about 400 Å. The forth dielectric layer 124 may be made of silicon oxide formed by LPCVD, for example.

Figure 1E:
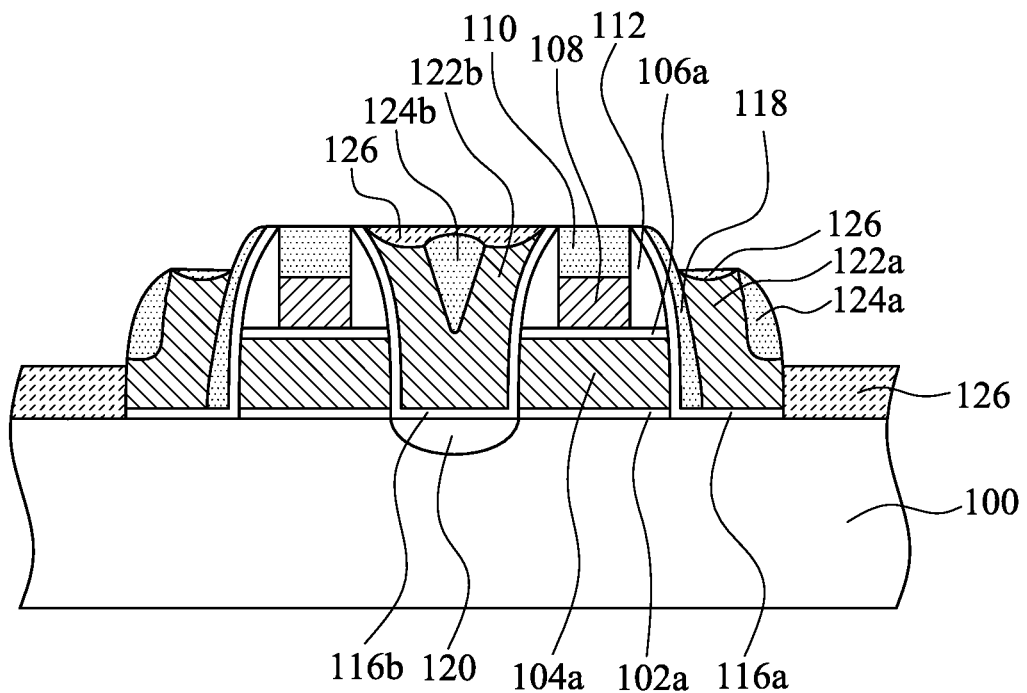

In FIG. 1E, the fourth dielectric layer 124 is anisotropically etched to form first side cap layers 124a on the word lines 122a and first middle cap layers 124b on the erase gates 122b, and the etching is stopped on the third polysilicon layer 122. Subsequently, the exposed third polysilicon layer 122 is anisotropically etched to form word lines 122a next to the second spacers 118 and erase gate 122b above the common source 120, and the etching is stopped on the first buffer layer 116a. The anisotropic etching above may be performed by dry etching.

Pleased noted that since the first buffer layer 116a is quite thin, and thus the exposed portions of the first buffer layer 116a may be easily etched away to expose the substrate 100 thereunder during the etching of the third polysilicon layer 122. Therefore, an organic material is spin coated above the substrate 100 to form an organic layer 126 covering the exposed top surface of the substrate 100 to protect the exposed substrate 100. Simultaneously, since the exposed top surfaces of the word lines 122a and the erase gate 122b are etched to have a concave top surface, the organic material also can be spin coated on the top surfaces of the word lines 122a and the erase gate 122b. In addition, the thickness of the organic layer 126 covering the substrate 100 is more than the thickness of the organic layer 126 covering the word lines 122a and the erase gate 122b to provide a better protection to the substrate 100. The organic material above may be photoresist or other organic polymers that can be spin-coated to protect the exposed substrate 100 during the subsequent etching of the word lines 122a and the erase gate 122b.

Figure 1F:
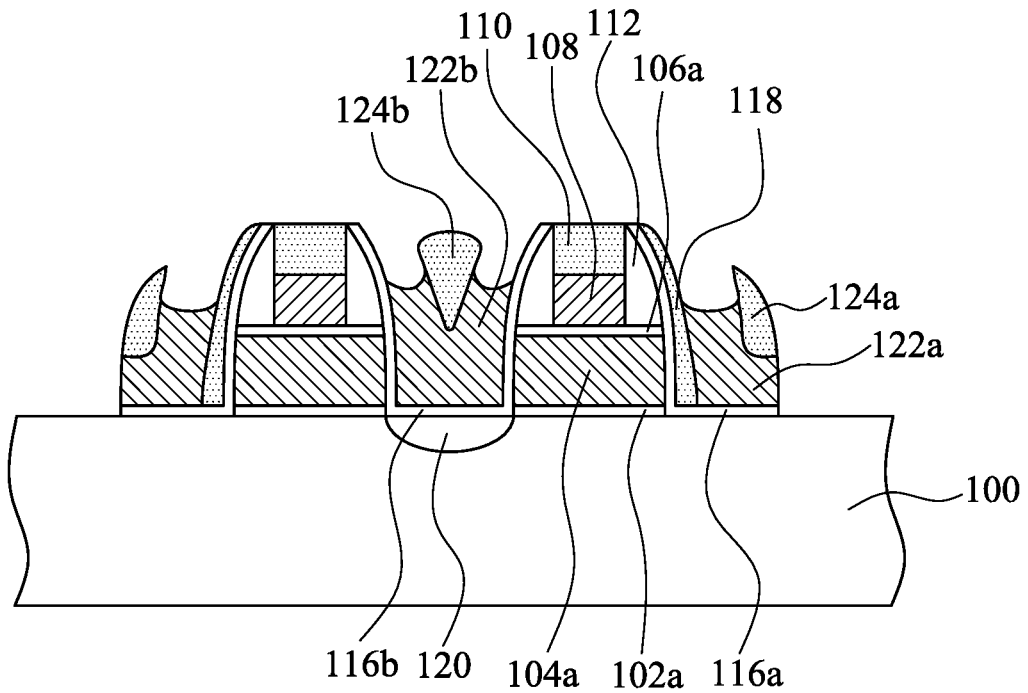

In FIG. 1F, the organic layer 126 is etched to expose the top surfaces of the word lines 122a and the erase gate 122b, but the top surface of the substrate 100 is still covered by the organic layer 126. Next, the exposed word lines 122a and the exposed erase gate 122b are selectively etched back by isotropic dry etching to avoid damaging the second spacers 118, the first side cap layers 124a and the first middle cap layers 124b made of silicon nitride. Therefore, the level of the top surfaces of the word lines 122a and the erase gate 122b are lowered. Then, the remained organic layer 126 on the substrate 100 is removed by solvent stripping, for example.

According to some embodiments, the isotropic dry etching above may be performed by an inductively-coupled plasma (ICP) poly etcher. The source of the etching plasma may include a mixture of 5-50 sccm of $SF_6$ and 100-600 sccm of a carrier gas, and the carrier gas may be Ar or He. The pressure in the reactive chamber may be increased to 3-50 mTorr, and the ICP power may be increased to 200-600 W. In addition, the bias voltage may be decreased to 0-100 V. Since $SF_6$ is used as the source of the etching plasma, the dry etching can be isotropic.

According to some other embodiments, the dry etching above may be performed by a chemical dry etcher. The chemical dry etcher equipped with a remote plasma source to decrease the kinetic energy of the generated plasma to almost zero. Therefore, an isotropic etching can be performed to decrease the damage caused by high kinetic energy plasma. In the chemical dry etching (CDE) process, the source of the plasma may include a mixture of $C_xH_yF_z$ and oxygen. The total flow rate of the mixture gas may be 300-800 sccm, and the flow rate ratio of the $C_xH_yF_z$ to oxygen may be 0.5-1.5. The $C_xH_yF_z$ may be $CH_2F_2$, $CHF_3$, $CF_4$, $C_2F_6$, $C_3F_8$, $C_4F_6$, or $C_5F_8$. The pressure of the reactive chamber may be 200-500 mTorr. The etching selectivity of silicon over silicon nitride is about 3-10, and thus the damage of the second spacers 118, the first side cap layers 124a and the first middle cap layers 124b may be effectively decreased.

Figure 1G:
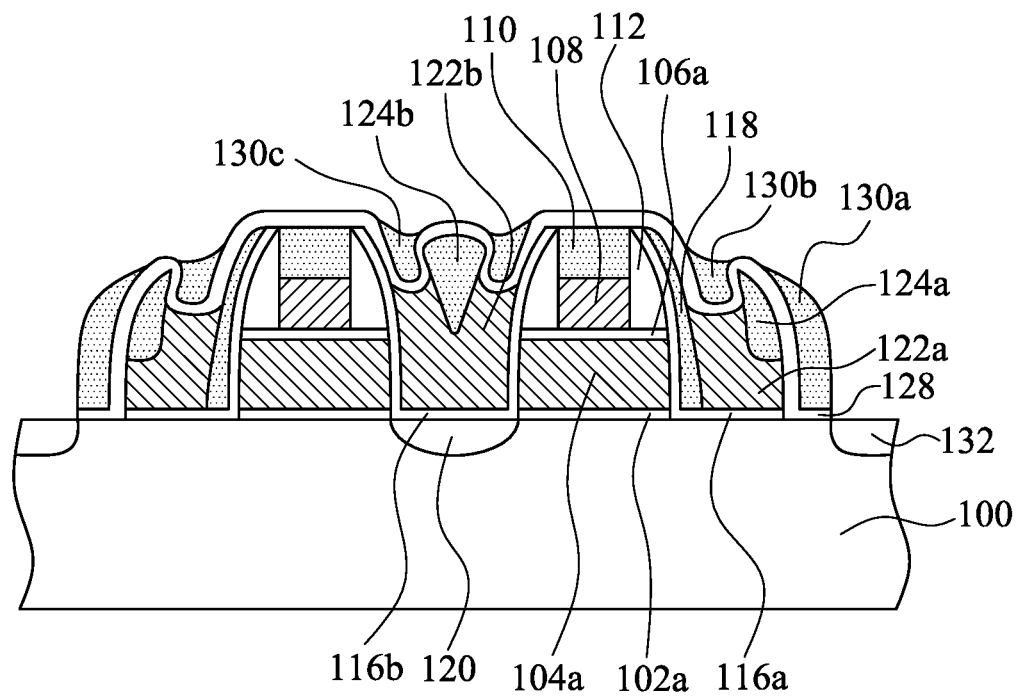

In FIG. 1G, a second buffer layer 128 and a fifth dielectric layer are sequentially formed above the substrate 100 to cover the structures on the substrate 100. The fifth dielectric layer is then anisotropically etched to form third spacers 130a on sidewalls of the word lines 122a, second side cap layers 130b on the top surface of the word lines 122a and second middle cap layers 130c on the erase gate 122b. At the same time, the exposed second buffer layer 128 is also etched away during the etching of the fifth dielectric layer, since the second buffer layer 128 is kind of thin. The second buffer layer 128 may be a silicon oxide layer formed by CVD. The fifth dielectric layer may be a silicon nitride layer formed by LPCVD. The anisotropic etching may be performed by dry etching, for example. Similarly, the second buffer layer 128 may be omitted when the lattice mismatch between the fifth dielectric layer and the exposed silicon layers is not obvious to create obvious strain.

Subsequently, a self-aligned silicidation (salicide) process is performed to form metal silicide on exposed surfaces of silicon material on both the nonvolatile memory area and the logic area. Therefore, metal silicide will be formed on the exposed surfaces of the substrate 100 and other polysilicon layers. Please note that since the exposed surfaces of the word lines 122a and the erase gate 122b have been covered by the second buffer layer 128, first side cap layers 124a, first middle cap layers 124b, third spacers 130a, second side cap layers 130b, and second middle cap layer 130c, no metal silicide can be formed on the top surface of the word lines 122a and the erase gate 122b. In the nonvolatile memory area, metal silicide layers 132 can be formed only on the exposed surfaces of the substrate 100 to be used as drains.

Figure 1H:
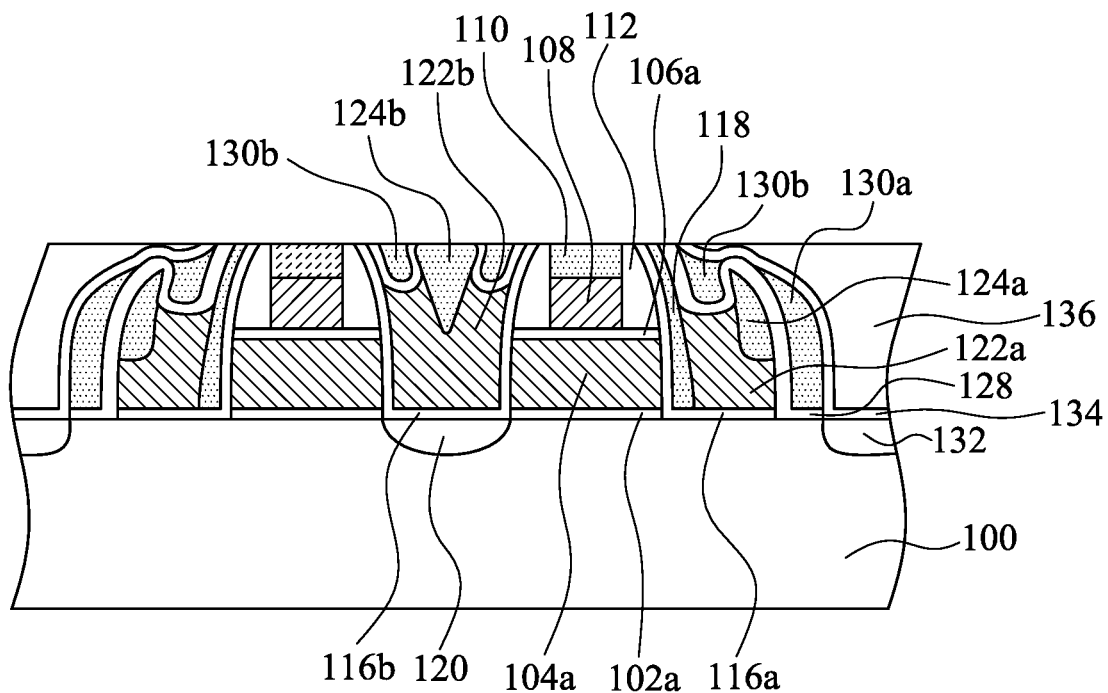

In FIG. 1H, an etching stop layer 134 is formed above the substrate 100 to conformally covered the structures on the substrate 100. The material of the etching stop layer 134 may be silicon nitride formed by LPCVD, for example. Then, a low-k dielectric layer 136 is formed above the substrate 100 to cover the structures formed on the substrate 100. A process of chemical mechanical polishing (CMP) is subsequently performed to polish the whole wafer to remove an upper portion of the low-k dielectric layer 136, and the CMP is stopped on the mask layer 110. Hence, the thickness of the mask layer 110 is decreased further.

The material of the low-k dielectric layer 136 may be made from a dielectric material having a dielectric constant smaller than the dielectric constant of silicon dioxide (i.e. a low-k dielectric material). Common low-k dielectric material includes fluorine-doped silicon dioxide, carbon-doped silicon dioxide, porous silicon dioxide, porous carbon-doped silicon dioxide, a spin-on organic polymeric dielectric (such as polyimide, polynorbornenes, benzocyclobutene, or polytetrafluoroethylene), a spin-on silicone based polymeric dielectric (such as hydrogen silsesquioxane (HSQ) and methylsilsesquioxane (MSQ)).

Figure 2A:
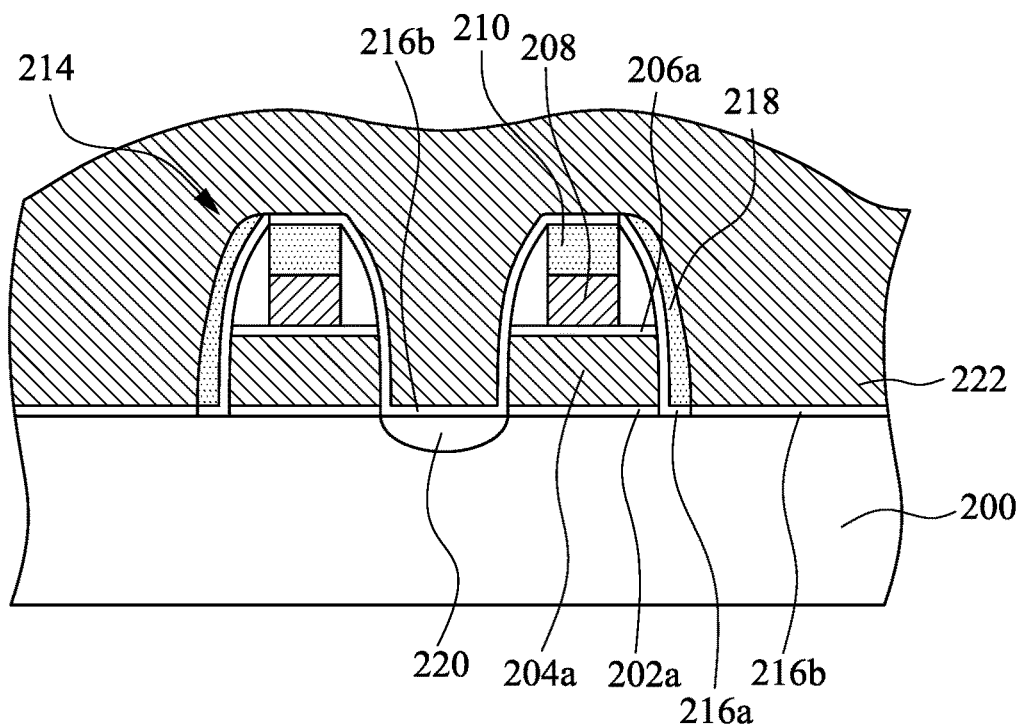
FIGS. 2A-2D are cross-sectional diagrams showing a process of embedded nonvolatile memory according to some other embodiments of this disclosure.

FIGS. 2A-2D are cross-sectional diagrams showing a process of embedded nonvolatile memory according to some other embodiments of this disclosure. Since the processes before FIG. 2A are similar to FIGS. 1A-1C, the figures and the detailed descriptions are omitted here. In addition, the reference numbers in FIG. 2A representing the same or similar components are obtained by adding 100 to the reference numbers in FIG. 1C, and the meanings of the reference numbers in FIG. 2A representing the same or similar components are thus not described repeatedly. In FIGS. 2A-2D, the third polysilicon layer 122 and the fourth dielectric layer 124 in FIG. 1D is replaced by only a third polysilicon layer 222 in FIG. 2A, and the third polysilicon layer 222 is etched to form the word lines 222a and the erase gate 222b having top surfaces not higher than the top surfaces of the control gate 208 in FIG. 2B to avoid forming metal silicide on the top surfaces of the word lines 222a and the erase gates 222b. The detailed descriptions of FIGS. 2A-2D are described below.

After the removal of the photoresist layer 121 in FIG. 1C, the exposed first buffer layer 216a is then removed in FIG. 2A. The removal method of the exposed first buffer layer 216a may be wet etching, for example. A gate oxide layer 216b is grown to cover the exposed surfaces of the substrate 200, the floating gate 204a and the common source 220. The formation method of the gate oxide layer 216b may be performed by thermal oxidation. Next, a third polysilicon layer 222 is formed to cover the substrate 200, and the thickness of the third polysilicon layer 222 is greater than the total thickness of the gate stacks 214. According to some embodiments, the thickness of the third polysilicon layer 222 is in a range from about 1800 Å to about 2200 Å.

Figure 2B:
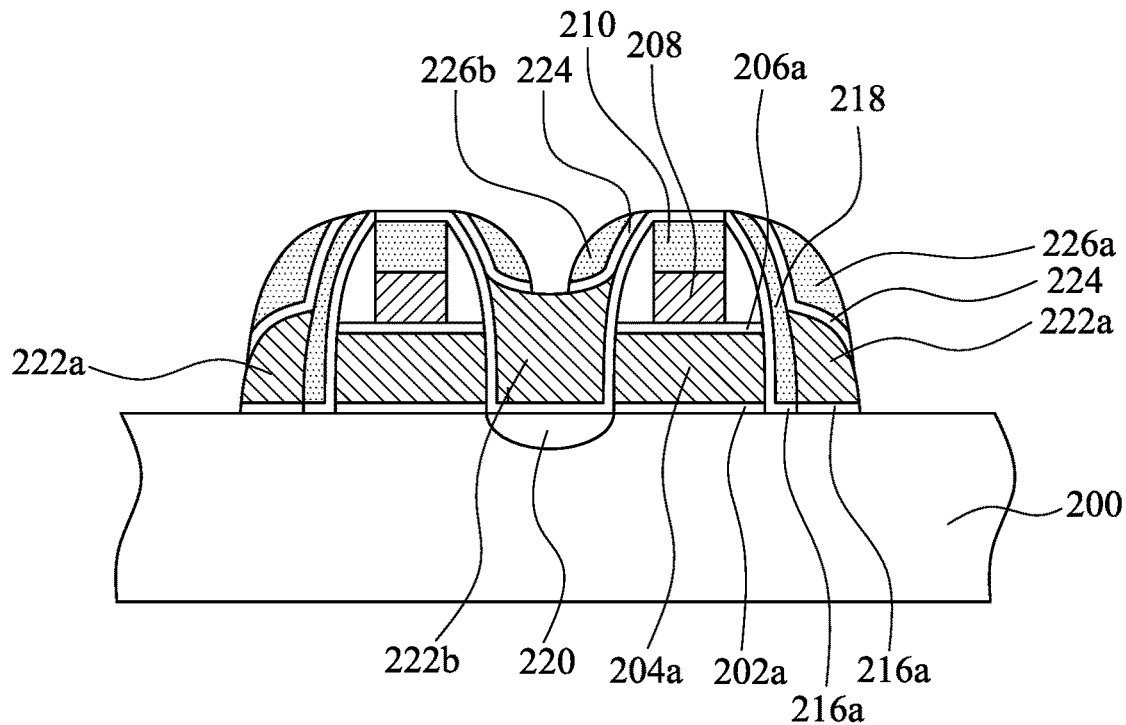

In FIG. 2B, the third polysilicon layer 222 is anisotropically etched until the substrate 200 is exposed to form word lines 222a and erase gate 222b. Then, a second buffer layer 224 and a fourth dielectric layer are sequentially formed above the substrate 200. The fourth dielectric layer is anisotropically etched to form side cap layers 226a on the word lines 222a and first middle cap layers 226b on the erase gates 222b, and the exposed second buffer layer 224 is consumed during the etching of the fourth dielectric layer. Next, the exposed word lines 222a are further etched by using the side cap layers 226a as an etching mask to modify the profile of the word lines 222a. As for the erase gate 222b, since the fourth dielectric layer is thicker over the erase gate 222b, the erase gate 222b is finally not etched during the etching back of the word lines 222a.

Figure 2C:
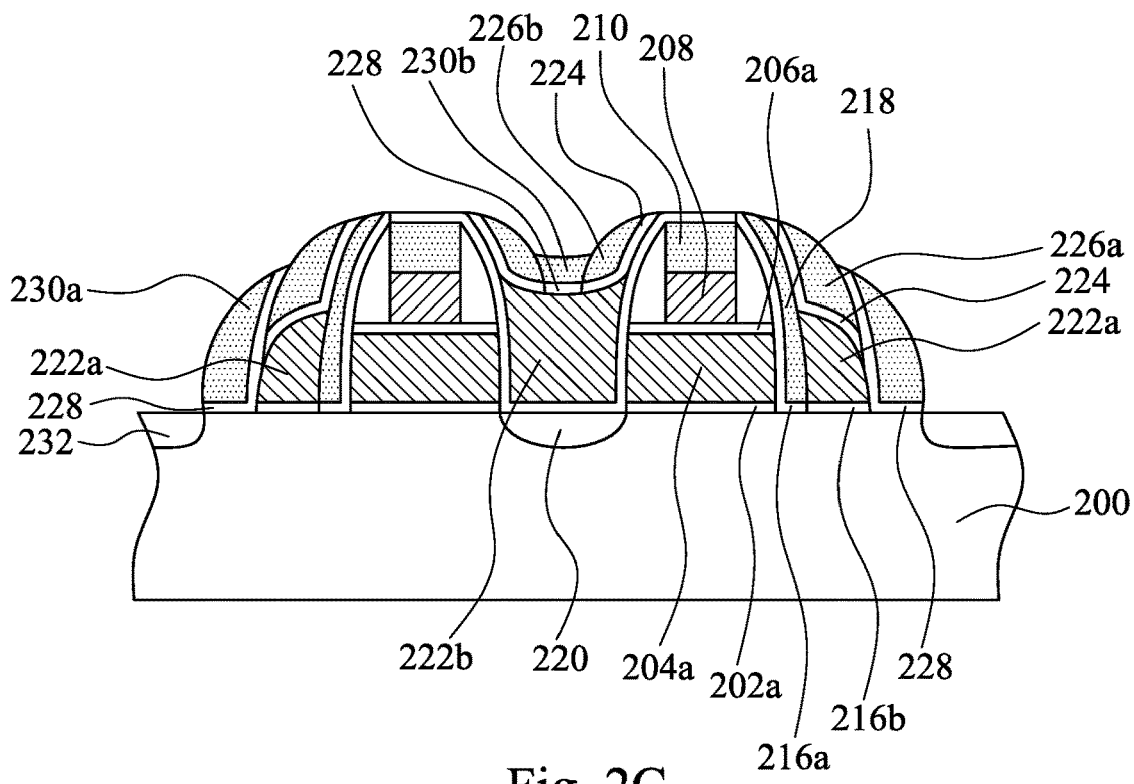

In FIG. 2C, a third buffer layer 228 and a fifth dielectric layer are sequentially formed above the substrate 200. The fifth dielectric layer is anisotropically etched to form third spacers 230a on sidewalls of the word lines 222a and a second middle cap layer 230b on the erase gates 222b. The exposed third buffer layer 228 is consumed during the etching of the fifth dielectric layer. The third buffer layer 228 may be a silicon oxide layer formed by CVD. The fifth dielectric layer may be a silicon nitride layer formed by LPCVD. Similarly, the third buffer layer 228 may be omitted if the stress between the fifth dielectric layer and the exposed silicon layers is not too much.

Then, a self-aligned silicidation (salicide) process is performed to form metal silicide on exposed surfaces of silicon material on both the nonvolatile memory area and the logic area. Therefore, the exposed surface of the substrate 200 and other polysilicon layers will have metal silicide 232 formed thereon. Please note that since the top surfaces of the word lines 222a and the erase gate 222b are not exposed, no metal silicide can be formed on the top of the word lines 222a and the erase gate 222b.

Figure 2D:
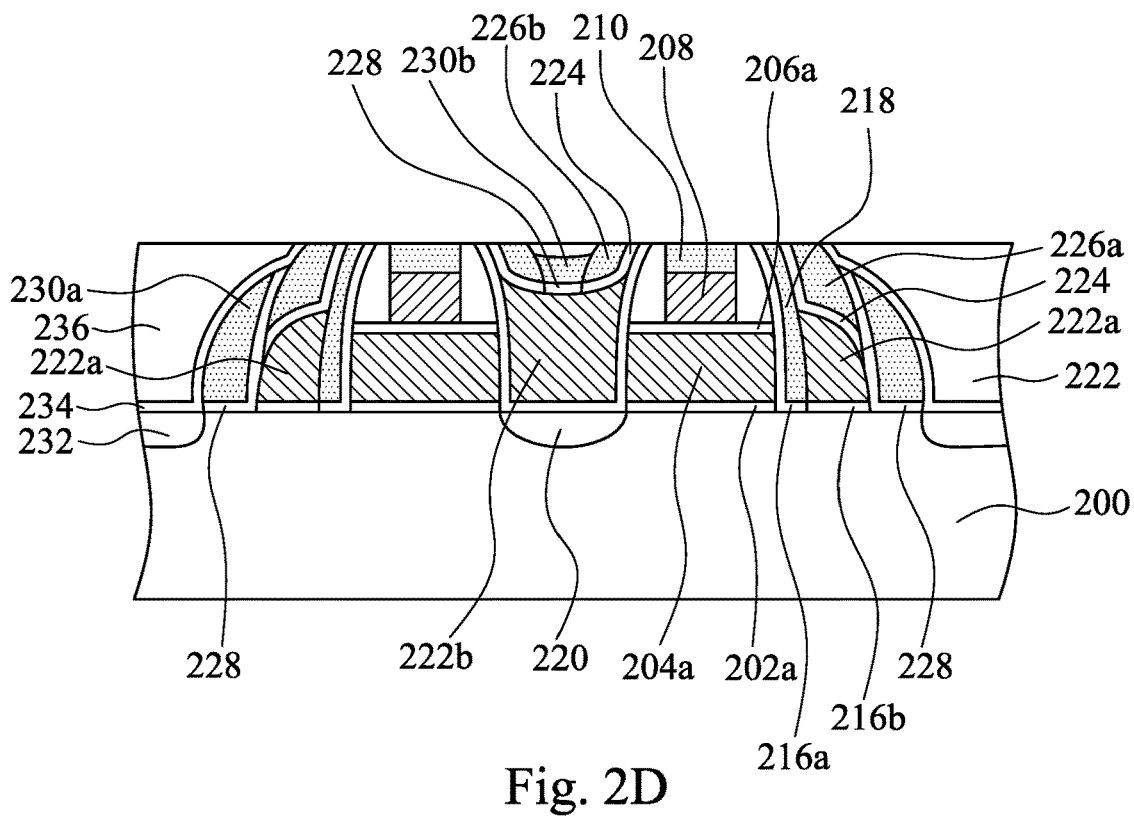

In FIG. 2D, an etching stop layer 234 is formed above the substrate 200 to conformally covered the structure on the substrate 200. The material of the etching stop layer 234 may be silicon nitride, for example. Then, a low-k dielectric layer 236 is formed above the substrate 200 to cover the structures formed on the substrate 200. A process of chemical mechanical polishing (CMP) is subsequently performed to polish the whole wafer to remove an upper portion of the low-k dielectric layer 236, and the CMP is stopped on the mask layer 210. Hence, the thickness of the mask layer 210 is decreased further. The material of the low-k dielectric layer 236 is similar to the material of the low-k dielectric layer 136, and hence omitted here.

Figure 3A:
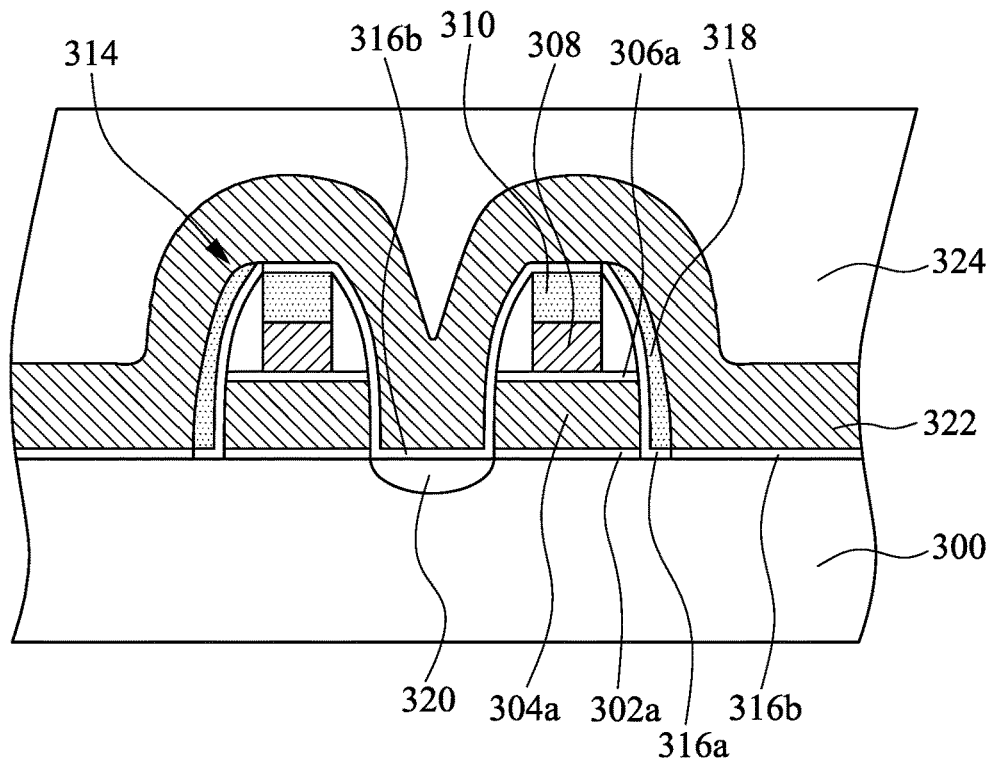
FIGS. 3A-3D are cross-sectional diagrams showing a process of embedded nonvolatile memory according to some other embodiments of this disclosure.

FIGS. 3A-3D are cross-sectional diagrams showing a process of embedded nonvolatile memory according to some other embodiments of this disclosure. Since the processes before FIG. 3A are similar to FIGS. 1A-1C, the figures and the detailed descriptions are omitted here. In addition, the reference numbers in FIG. 3A representing the same or similar components are obtained by adding 200 to the reference numbers in FIG. 1C, and the meanings of the reference numbers in FIG. 3A representing the same or similar components are not described repeatedly. In FIGS. 3A-3D, the third polysilicon layer 222 in FIG. 2A is replaced by a third polysilicon layer 322 and an organic layer 324 in FIG. 3A. Therefore, the organic layer 324 and the third polysilicon layer 322 are non-selectively etched back to leave the third polysilicon layer 322 having a top surface not higher than the top surface of the control gate 308 in FIG. 3B. Thus, metal silicide can be avoided to be formed on the top surfaces of the word lines 322a and the erase gate 322b. The detailed descriptions of FIGS. 3A-3D are described below.

After the removal of the photoresist layer 121 in FIG. 1C, the exposed first buffer layer 316a is then removed in FIG. 3A. The removal method of the exposed first buffer layer 316a may be wet etching, for example. A gate oxide layer 316b is grown to cover the exposed surfaces of the substrate 300, the floating gate 304a and the common source 320. The formation method of the gate oxide layer 316b may be performed by thermal oxidation. Next, a third polysilicon layer 322 and an organic layer 324 is formed to cover the substrate 300. The thickness of the third polysilicon layer 322 is smaller than a total thickness of the tunneling oxide layer 302a, the floating gate 304a, the middle dielectric layer 306a, and the control gates 308, such as in a range from about 400 Å to about 600 Å. The top surface of the organic layer 324 is higher than the top surfaces of the gate stacks 314. Therefore, the thickness of the organic layer 324 may be in a range from about 1000 Å to about 1500 Å according to some embodiments.

Figure 3B:
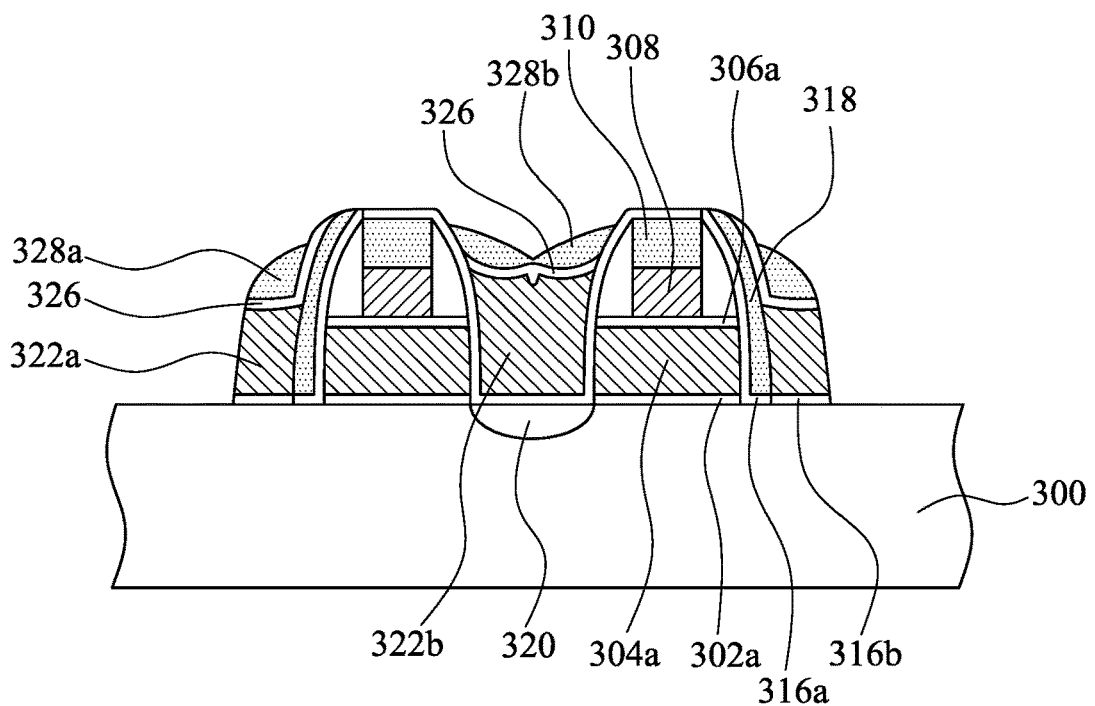

In FIG. 3B, the third polysilicon layer 322 and the organic layer 324 are non-selectively etched until the top surfaces of the third polysilicon layer 322 is lower than the top surfaces of the control gates 308. According to some embodiments, the thickness of the remained third polysilicon layer 322 is in a range from about 600 Å to about 800 Å. In this step, an erase gate 322b is formed. Then, the residue of the organic layer 324 is removed, and the removal may be performed by plasma ashing.

Next, a second buffer layer 326 and a fourth dielectric layer are sequentially formed above the substrate 300 to cover the structures on the substrate 300. The fourth dielectric layer is anisotropically etched to form side cap layers 328a on the word lines 322a and a first middle cap layer 328b on the erase gate 322b, and some of the exposed second buffer layer 326 is consumed during the etching of the fourth dielectric layer. Next, the exposed third polysilicon layer 322 is further etched by using the side cap layers 328a as an etching mask to form word lines 322a. The second buffer layer 326 may be a silicon oxide layer formed by CVD. The fourth dielectric layer may be a silicon nitride layer formed by LPCVD. Similarly, the second buffer layer 326 may be omitted when the strains between the fourth dielectric layer and the exposed silicon layer is not too much.

Figure 3C:
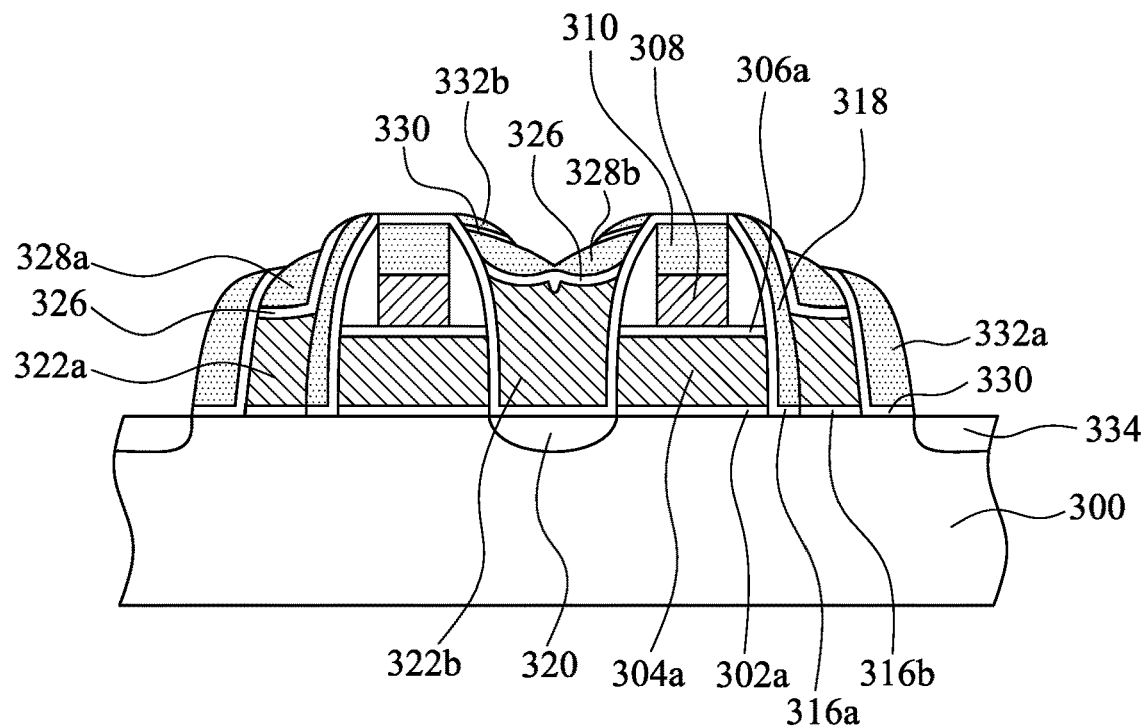

In FIG. 3C, a third buffer layer 330 and a fifth dielectric layer are sequentially formed above the substrate 300. The fifth dielectric layer is anisotropically etched to form third spacers 332a on sidewalls of the word lines 322a and a second middle cap layer 332b on the erase gate 322b. The exposed third buffer layer 330 is consumed during the etching of the fifth dielectric layer. The third buffer layer 330 may be a silicon oxide layer formed by CVD. The fifth dielectric layer may be a silicon nitride layer formed by LPCVD. Similarly, the third buffer layer 330 may be omitted when the strains between the fifth dielectric layer and the exposed silicon layer is not too much.

Then, a self-aligned silicidation (salicide) process is performed to form metal silicide 334 on exposed surfaces of silicon material on both the nonvolatile memory area and the logic area. Therefore, the exposed surface of the substrate 300 and other polysilicon layers will have metal silicide 334 formed thereon. Please note that since the top surfaces of the word lines 322a and the erase gate 322b are not exposed, no metal silicide can be formed on the top of the word lines 322a and the erase gate 322b.

Figure 3D:
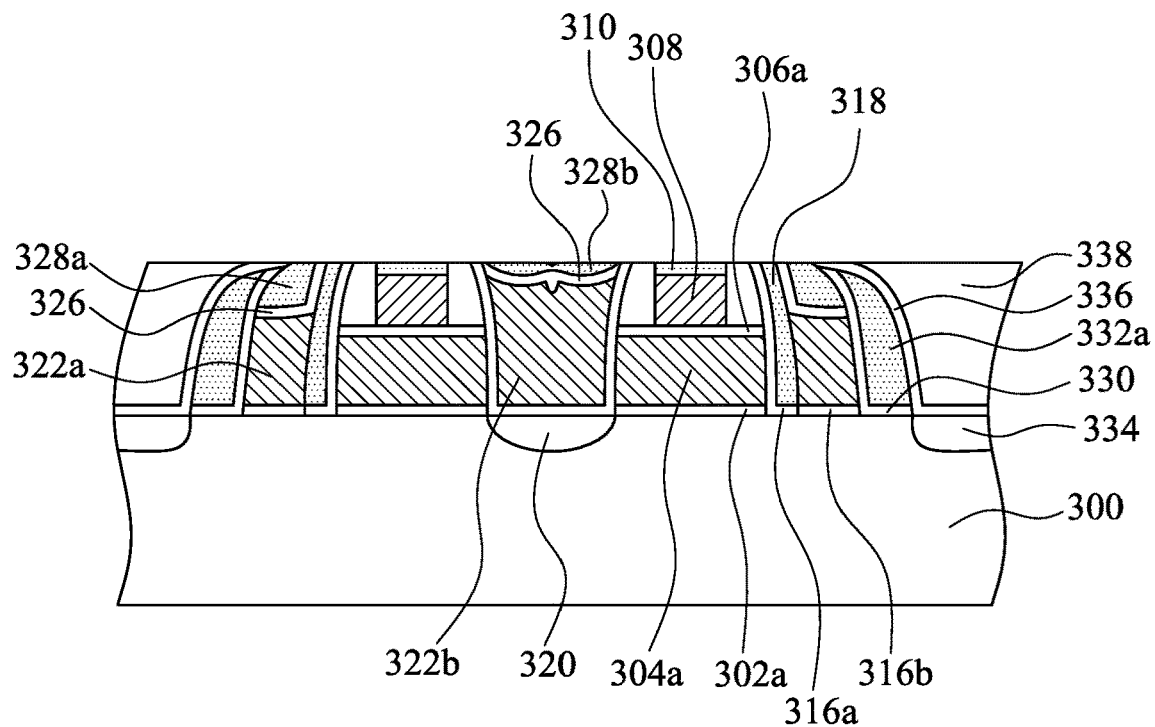

In FIG. 3D, an etching stop layer 336 is formed above the substrate 300 to conformally covered the structure on the substrate 300. The material of the etching stop layer 336 may be silicon nitride, for example. Then, a low-k dielectric layer 338 is formed above the substrate 300 to cover the structure formed on the substrate 300. A process of chemical mechanical polishing (CMP) is subsequently performed to polish the whole wafer to remove an upper portion of the low-k dielectric layer 338, and the CMP is stopped on the mask layer 310. Hence, the thickness of the mask layer 310 is decreased further. The material of the low-k dielectric layer 338 is similar to the material of the dielectric layer 136, and hence omitted here.

Accordingly, this disclosure provides three different method to lower the top surfaces of the word lines and erase gates, hence the word lines and erase gates can have top surfaces lower than the top surfaces of the control gates. Furthermore, dielectric cap layers are formed on top surfaces of the word lines and the erase gates, and dielectric spacers are formed on sidewalls of the word lines. Therefore, no surfaces of the word lines and erase gates are exposed when self-aligned silicidation process is performed on both the nonvolatile memory area and the 28 HPM logic area, and no metal silicide can be formed on the word lines and erase gate. Consequently, during the CMP process, no metal silicide can be spread out to produce problems of current leakage and short circuits.

According to some embodiments of this disclosure, a nonvolatile memory is provided, and the nonvolatile memory comprises the following components. At least two gate stacks are located on a substrate, wherein the gate stacks each from bottom to top sequentially comprises a tunneling oxide layer, a floating gate, a middle dielectric layer, a control gate, and a mask layer. First spacers are located on sidewalls of the two gate stacks. A gate dielectric layer located on the exposed substrate. An erase gate is located between the two gate stacks and has a nonplanar top surface not higher than top surfaces of the control gates. Two word lines are located on outer sides of the two gate stacks and have nonplanar top surfaces not higher than the top surfaces of the control gates. Cap layers are located respectively on the erase gate and the word lines.

According to some other embodiments of this disclosure, a nonvolatile memory is provided, and nonvolatile memory comprises the following components. At least two gate stacks are located on a substrate, wherein the gate stacks each from bottom to top sequentially comprises a tunneling oxide layer, a floating gate, a middle dielectric layer, a control gate, and a mask layer. First spacers are located on sidewalls of the two gate stacks. A gate dielectric layer located on the exposed substrate. An erase gate is located between the two gate stacks and has a curved top surface lower than top surfaces of the control gates. Two word lines have curved top surfaces lower than the top surfaces of the control gates. One of the gate stacks is located between one of the word lines and the erase gate. Cap layers are located respectively on the erase gate and the word lines.

According to some other embodiments of this disclosure, a method of forming a nonvolatile memory is provided. Two gate stacks are formed on a substrate, wherein the gate stacks each from bottom to top sequentially comprises a tunneling oxide layer, a floating gate, a middle dielectric layer, a control gate, and a mask layer. First spacers are formed on sidewalls of the two gate stacks. A gate dielectric layer is formed on the exposed substrate. An erase gate between the two gate stacks and two word lines located on outer sides of the two gate stacks are simultaneously formed, wherein the erase gate and the two word lines have top surfaces not higher than top surfaces of the control gates. Composite cap layers are formed respectively on the top surfaces of the erase gate and the word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nonvolatile memory, comprising:
a substrate having a source region and a drain region;
an erase gate over the source region;
a conductive feature over a portion of the substrate that is between the source region and the drain region, wherein the conductive feature comprises polysilicon;
a gate stack over the substrate and between the erase gate and the conductive feature, wherein the gate stack comprises a floating gate, a control gate over the floating gate, and a mask layer over the control gate; and
at least one cap layer over the erase gate, wherein a bottom surface of the at least one cap layer is in a position lower than a top surface of the control gate and a top surface of the at least one cap layer and a top surface of the mask layer are substantially coplanar.

2. The nonvolatile memory of claim 1, further comprising a buffer layer between the erase gate and the at least one cap layer.

3. The nonvolatile memory of claim 1, wherein the erase gate comprises polysilicon.

4. The nonvolatile memory of claim 1, wherein the bottom surface of the at least one cap layer is convex.

5. The nonvolatile memory of claim 1, wherein the gate stack further comprises a spacer between the control gate and the at least one cap layer.

6. The nonvolatile memory of claim 1, wherein a portion of a top surface of the erase gate is concave.

7. A nonvolatile memory, comprising:
a substrate;
an erase gate over the substrate;
a conductive feature over the substrate, wherein the conductive feature comprises polysilicon;
a gate stack over the substrate and between the erase gate and the conductive feature, wherein the gate stack comprises a floating gate and a control gate over the floating gate; and
at least one cap layer over the conductive feature, wherein a bottom surface of the at least one cap layer is in a position lower than a top surface of the control gate and is convex.

8. The nonvolatile memory of claim 7, further comprising a buffer layer between the conductive feature and the at least one cap layer.

9. The nonvolatile memory of claim 7, wherein a top surface of the conductive feature is concave.

10. The nonvolatile memory of claim 7, further comprising a buffer layer on at least a portion of a sidewall of the conductive feature.

11. The nonvolatile memory of claim 7, further comprising an etching stop layer having a portion over the at least one cap layer.

12. The nonvolatile memory of claim 11, further comprising a low-k dielectric layer covering the etching stop layer.

13. The nonvolatile memory of claim 7, wherein the conductive feature is in contact with the at least one cap layer.

14. A semiconductor device comprising:
a word line having a concave top surface;
an erase gate;
a control gate between the word line and the erase gate, wherein a top surface of the erase gate is at a position lower than a top surface of the control gate;
a cap layer over the erase gate; and
a mask layer over the control gate and having a top surface coplanar with a top surface of the cap layer.

15. The semiconductor device of claim 14, further comprising a floating gate over which is the control gate.

16. The semiconductor device of claim 14, further comprising:
a first buffer layer over the control gate; and
a second buffer layer over the erase gate and in contact with the first buffer layer.

17. The semiconductor device of claim 14, further comprising:
a first buffer layer over the control gate; and
a second buffer layer over the word line and spaced from the first buffer layer.

18. The semiconductor device of claim 17, further comprising a gate oxide layer over which is the word line and in contact with the first buffer layer.

19. The semiconductor device of claim 14, further comprising:
a conductive feature over a substrate, the conductive feature comprises polysilicon; and
another cap layer over the conductive feature, wherein a bottom surface of the other cap layer is in a position lower than the top surface of the control gate and is convex.

20. The semiconductor device of claim 14, further comprising:
a gate oxide layer on a sidewall of the erase gate and having a top surface coplanar with the top surface of the cap layer.

* * * * *